(12) United States Patent
Liu et al.

(10) Patent No.: US 9,537,022 B2
(45) Date of Patent: Jan. 3, 2017

(54) WAVELENGTH CONVERTING MATERIAL

(75) Inventors: Tzu-Chen Liu, Hsinchu (TW); Ru-Shi Liu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 1129 days.

(21) Appl. No.: 13/564,921

(22) Filed: Aug. 2, 2012

(65) Prior Publication Data

US 2014/0034900 A1 Feb. 6, 2014

(51) Int. Cl.
*C09K 11/77* (2006.01)
*H01L 31/0232* (2014.01)
*H01L 31/055* (2014.01)
*H01L 33/50* (2010.01)

(52) U.S. Cl.
CPC ..... *H01L 31/02322* (2013.01); *C09K 11/7796* (2013.01); *H01L 31/055* (2013.01); *H01L 33/502* (2013.01); *Y02E 10/52* (2013.01)

(58) Field of Classification Search
CPC .......................... C09K 11/7778; C09K 11/7796
USPC .................................................... 252/301.4 P
See application file for complete search history.

(56) References Cited

FOREIGN PATENT DOCUMENTS

| GB | 1498796 | * | 1/1978 |
| TW | I326704 | | 7/2010 |

OTHER PUBLICATIONS

Chen. An intense green emitting LiSrPO4:Eu2+, Tb3+ for phosphor-converted LED. Sensors and Actuators B 148 (2010) 259-263.*
Ming. Preparation and Near Infrared Luminescence of Novel ND3+ doped phosphors. Oct. 5, 2010. Thesis.*
Huang. Luminescence Properties of Yb2+ doped NaBaPO4 Phosphate crystals. Journal of The Electrochemical Society, 158 (5) H465-H470 (2011).*
Rene T. Wegh, Harry Donker, Koenraad D. Oskam, Andries Meijerink, Visible Quantum Cutting in LiGdF4:Eu31 Through Downconversion, Science, vol. 283, Jan. 29, 1999.
T. Trupke and M. A. Green, P. Wurfel, Improving solar cell efficiencies by down-conversion of high-energy photons, Journal of Applied Physics, vol. 92, No. 3, Aug. 1, 2002.
Q. Y. Zhang and G. F. Yang, Z. H. Jiang, Cooperative downconversion in GdAl3(BO3)4:RE3+,Yb3+(RE=Pr, Tb, and Tm), Applied Physics Letters, 91, 051903 (2007).
Qiuhong Zhang, Jing Wang, Gongguo Zhang and Qiang Su, UV photon harvesting and enhanced near-infrared emission in novel quantum cutting Ca2BO3Cl:Ce3+,Tb3+,Yb3+ phosphor, Journal of Materials Chemistry, 2009, 19, 7088-7092.

* cited by examiner

*Primary Examiner* — Matthew E Hoban
(74) *Attorney, Agent, or Firm* — Ditthavong & Steiner, P.C.

(57) ABSTRACT

A wavelength converting material comprising a phosphate compound have a chemical formula of $AB_{1-m-n}PO_4:M_m, N_n$, wherein A comprises an alkali metal element, B comprises an alkaline earth metal element, M is a sensitizer comprising a rare-earth element, and N is an acceptor comprising a rare-earth element, wherein $0<m\le0.3$ and $0<n\le0.3$.

19 Claims, 3 Drawing Sheets

WAVELENGTH CONVERTING MATERIAL

TECHNICAL FIELD

The application relates to a wavelength converting material, and more particularly, to a wavelength converting material comprising a phosphate compound, and the application thereof.

DESCRIPTION OF BACKGROUND ART

Solar cell or photovoltaic device suffers conversion inefficiency; they are typically able to convert only a portion of the solar spectrum, the longer wavelength between 400 nm and 1100 nm for example, to electricity, and the shorter wavelength lower than 400 nm (higher energy portion) is wasted. To improve the conversion efficiency of the solar cell or the photovoltaic device, a number of schemes have been proposed in past decades. These schemes have attempted to make use of the solar spectrum more efficiently.

The mechanism of quantum cutting absorbs a high-energy photon and emits two low-energy photons. A quantum cutting phosphor (QC phosphor) based on the mechanism of quantum cutting could generate two low-energy photons corresponding to one incident high-energy photon, and the quantum efficiency is two. The development of near IR quantum cutting phosphor opens a new approach in achieving high efficiency of silicon-based solar cell by absorbing one photon in the UV part of the solar spectrum and emitting two photons near 1000 nm.

SUMMARY OF THE APPLICATION

A wavelength converting material comprising a phosphate compound have a chemical formula of $AB_{1-m-n}PO_4:M_m, N_n$, wherein A comprises an alkali metal element, B comprises an alkaline earth metal element, M is a sensitizer comprising a rare-earth element, and N is an acceptor comprising a rare-earth element, wherein $0<m\leq 0.3$ and $0<n\leq 0.3$, wherein A is at least one element selected from the group consisting of Li, Na, K, Rb and Cs, B is at least one element selected from the group consisting of Mg, Ca, Sr, and Ba, M is at least one element selected from the group consisting of Sc, Y, La, Ce, Pr, Nd, Pm, Sm, Eu, Gd, Tb, Dy, Ho, Er, Tm, Yb and Lu, and N is at least one element selected from the group consisting of Sc, Y, La, Ce, Pr, Nd, Pm, Sm, Eu, Gd, Tb, Dy, Ho, Er, Tm, Yb and Lu.

DETAILED DESCRIPTION OF PREFERRED EMBODIMENTS

Figure 1:
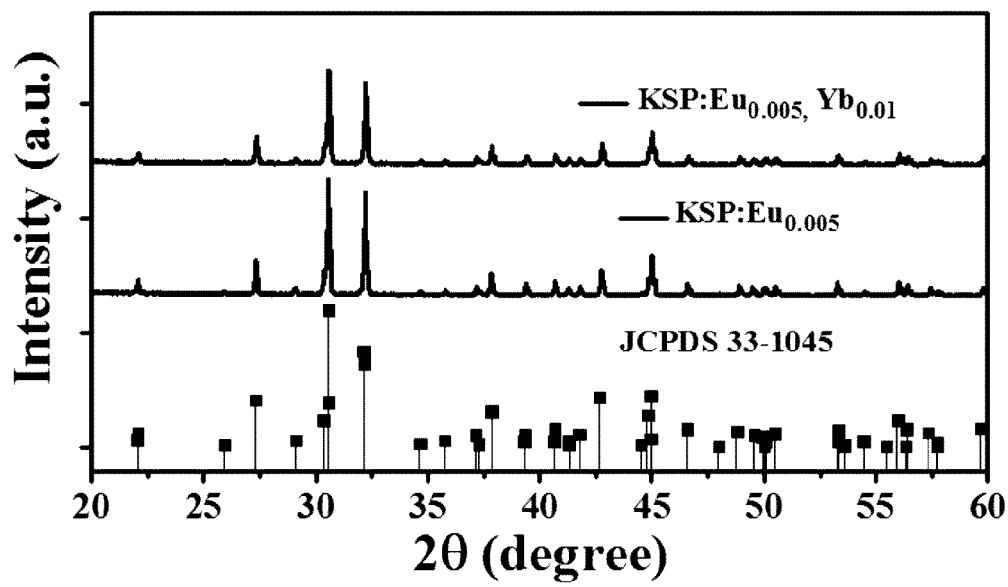
FIG. 1 illustrates an X-ray diffraction diagram of $KSr_{0.995}PO_4:Eu_{0.005}$ and $KSr_{0.985}PO_4:Eu_{0.005}, Yb_{0.01}$.

The embodiments of the application are illustrated in detail, and are plotted in the drawings. The same or the similar part is illustrated in the drawings and the specification with the same number.

The present application discloses a wavelength converting material comprising a phosphate compound having a chemical formula of $AB_{1-m-n}PO_4:M_m, N_n$, wherein A comprises an alkali metal element, B comprises an alkaline earth metal element, M is a sensitizer comprising a rare-earth element, and N is an acceptor comprising a rare-earth element, and wherein $0<m\leq 0.3$ and $0<n\leq 0.3$, wherein A is at least one element selected from the group consisting of Li, Na, K, Rb and Cs, B is at least one element selected from the group consisting of Mg, Ca, Sr, and Ba, M is at least one element selected from the group consisting of Sc, Y, La, Ce, Pr, Nd, Pm, Sm, Eu, Gd, Tb, Dy, Ho, Er, Tm, Yb and Lu, and N is at least one element selected from the group consisting of Sc, Y, La, Ce, Pr, Nd, Pm, Sm, Eu, Gd, Tb, Dy, Ho, Er, Tm, Yb and Lu.

The phosphate compound as disclosed in the present application can be synthesized by solid-state reaction, chemical synthesis, citrate gelation process, or spray pyrolysis. The embodiment is exemplified by solid-state reaction for the illustration of synthesis of $KSr_{0.985}PO_4:Eu_{0.005}, Yb_{0.01}$. The method includes steps of preparing a first reactant comprising alkali metal phosphate such as $KH_2PO_4$, a second reactant comprising alkaline earth metal carbonate such as $SrCO_3$, a third reactant comprising oxide of rare-earth element such as $Eu_2O_3$, and a fourth reactant comprising oxide of rare-earth element such as $Yb_2O_3$ with stoichiometric amount. The rare-earth elements in the third reactant such as Eu and the fourth reactant such as Yb form a pair system capable of transferring energy from Eu to Yb with 4f-5d allowed transition of chemistry electronic transition. Then the first reactant, the second reactant, the third reactant, and the fourth reactant are thoroughly mixed and ground in a mortar. Next, the mixed reactants are put into a furnace. In the process, a mixture gas such as hydrogen/nitrogen is introduced into the furnace with a percentage 5%/95% and the pressure is preferably set at 1 atm. The mixed reactants are fired under a furnace temperature between 1000-1500° C., preferably 1300° C., for 1~8 hours, preferably for 3 hours. Afterward, the phosphate compound $KSr_{0.985}PO_4:Eu_{0.005}, Yb_{0.01}$ capable of being excited to emit near infrared light is provided.

FIG. 1 shows an X-ray diffraction diagram of $KSr_{0.985}PO_4:Eu_{0.005}, Yb_{0.01}$ in accordance with embodiments of the present application. From the comparison between the sample provided by the present application and the standard sample of phosphate compound $KSr_{0.995}PO_4:Eu_{0.005}$ as shown in FIG. 1, the structure in accordance with the present application is orthorhombic ($a\neq b\neq c$, $\alpha=\beta=\gamma=90°$).

The thermal stability of the wavelength converting material is important to the optoelectronic application. The emission light intensity of $KSr_{0.995-y}PO_4:Eu_{0.005}, Yb_y, 0\leq y\leq 0.01$ decreases slowly compared with that of commercial YAG:Ce phosphor as temperature increases. The emission light intensity of $KSr_{0.995-y}PO_4:Eu_{0.005}, Yb_y$ decreases 10% of initial value at 150° C. and then 20% at 300° C. The emission light intensity of commercial YAG:Ce phosphor decreases more than 30% at 300° C.

Figure 2:
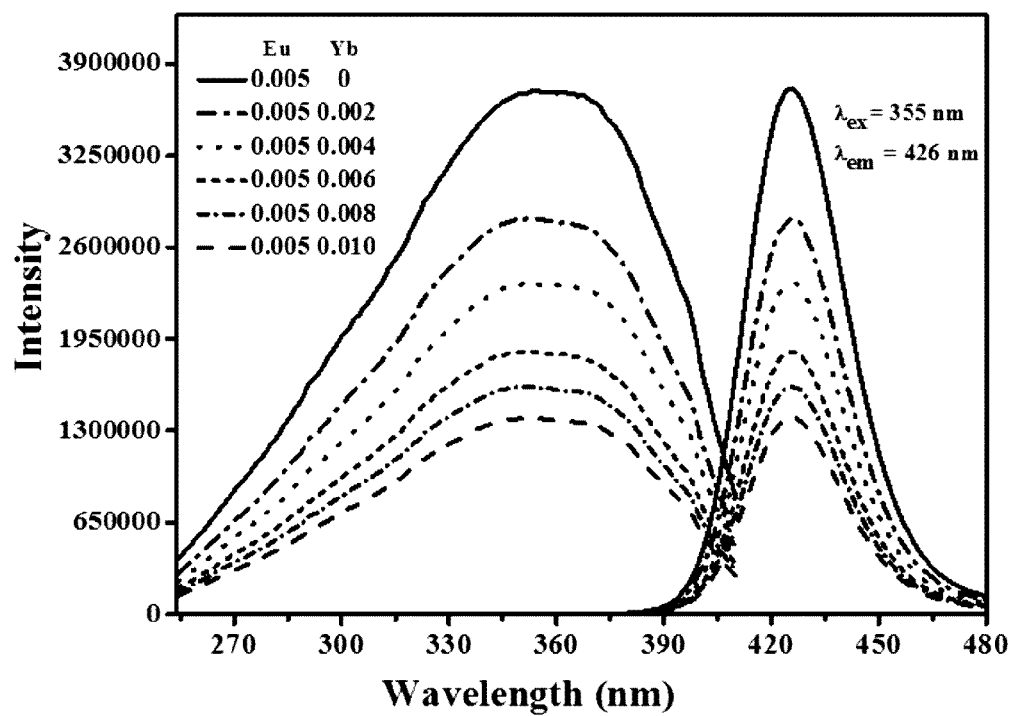
FIG. 2 illustrates a diagram of excitation and emission spectrum of $KSr_{0.995-y}PO_4:Eu_{0.005}, Yb_y, 0\leq y\leq 0.01$.

FIG. 2 shows a diagram of excitation and emission spectrum of $KSr_{0.995-y}PO_4:Eu_{0.005}, Yb_y, 0\leq y\leq 0.01$ in accordance with the present application. The wavelength converting material of $KSr_{0.995-y}PO_4:Eu_{0.005}, Yb_y, 0\leq y\leq 0.01$ in accordance with the present application is favorable to be excited by ultra-violet (UV) light, blue light, or UV light to near-UV light with wavelength spectrum between 250 nm and 450 nm, and more favorable to be excited by wavelength between 300 nm and 400 nm to achieve better light emitting characteristics.

Figure 3:
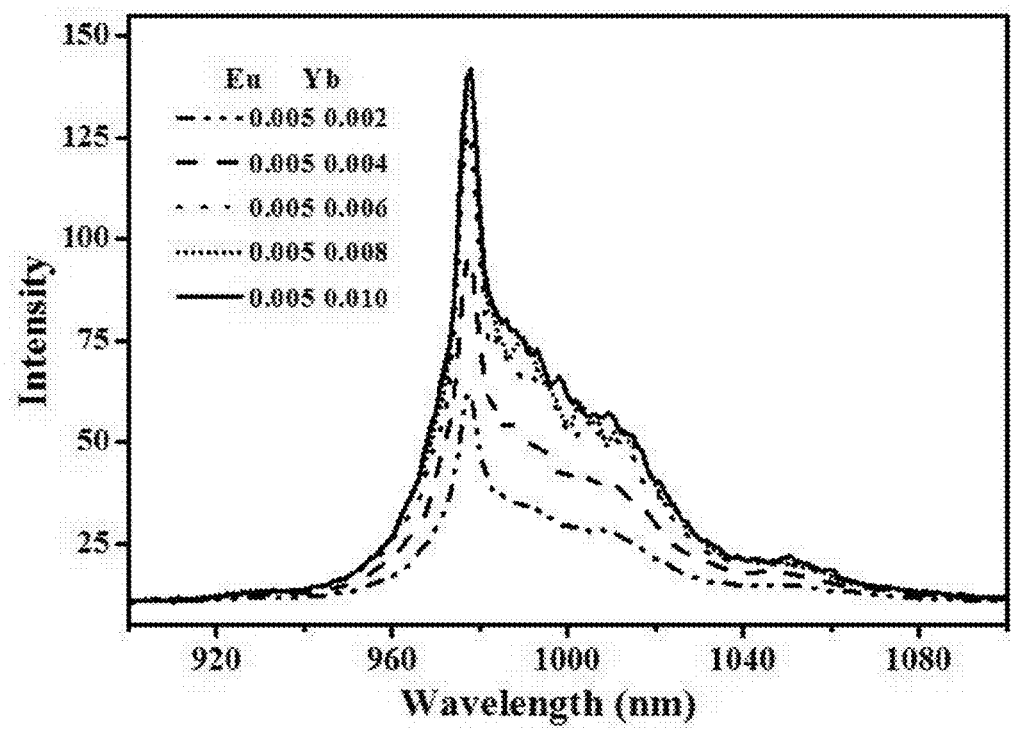
FIG. 3 illustrates a diagram of near infrared light emission spectrum of $KSr_{0.995-y}PO_4:Eu_{0.005}, Yb_y, 0<y\leq 0.01$.

As shown in FIGS. 2-3, the wavelength converting material $KSr_{0.995-y}PO_4:Eu_{0.005}, Yb_y$, $0 \le y \le 0.01$, is excited by a first light having a dominant wavelength between 250 nm and 450 nm to emit a second light having a dominant wavelength between 900 nm and 1100 nm. When the y content of the wavelength converting material $KSr_{0.995-y}PO_4:Eu_{0.005}, Yb_y$ is approximately zero, the wavelength converting material $KSr_{0.995-y}PO_4:Eu_{0.005}, Yb_y$ is excited by the first light having the dominant wavelength between 250 nm and 450 nm to emit blue light between 390 nm and 480 nm as shown in FIG. 2, and the second light having the dominant wavelength between 900 nm and 1100 nm is not emitted as shown in FIG. 3. When the y content of the wavelength converting material $KSr_{0.995-y}PO_4:Eu_{0.005}, Yb_y$ is increased from 0 to 0.01, the emission intensity of the blue light between 390 nm and 480 nm decreases as shown in FIG. 2 and the emission intensity of the second light having the dominant wavelength between 900 nm and 1100 nm increases as shown in FIG. 3.

In an embodiment of the application, the sensitizer such as Eu can absorb the energy of UV or blue light between 250 nm and 450 nm via 4f-5d transition, and the energy absorbed by the sensitizer can be transferred to the acceptor such as Yb to emit near infrared light between 900 nm and 1100 nm.

Figure 4:
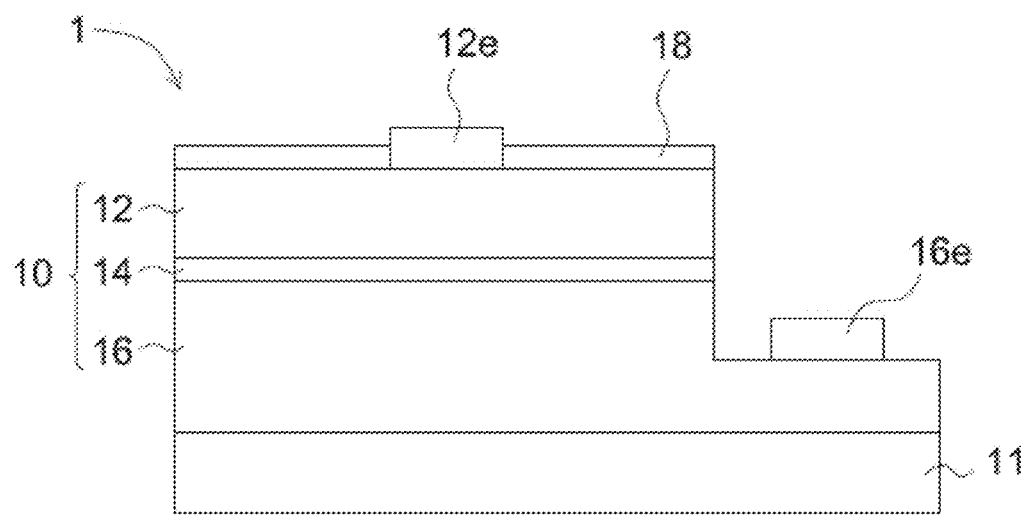
FIG. 4 illustrates an optoelectronic apparatus using a phosphate compound of the present application.
Figure 5:
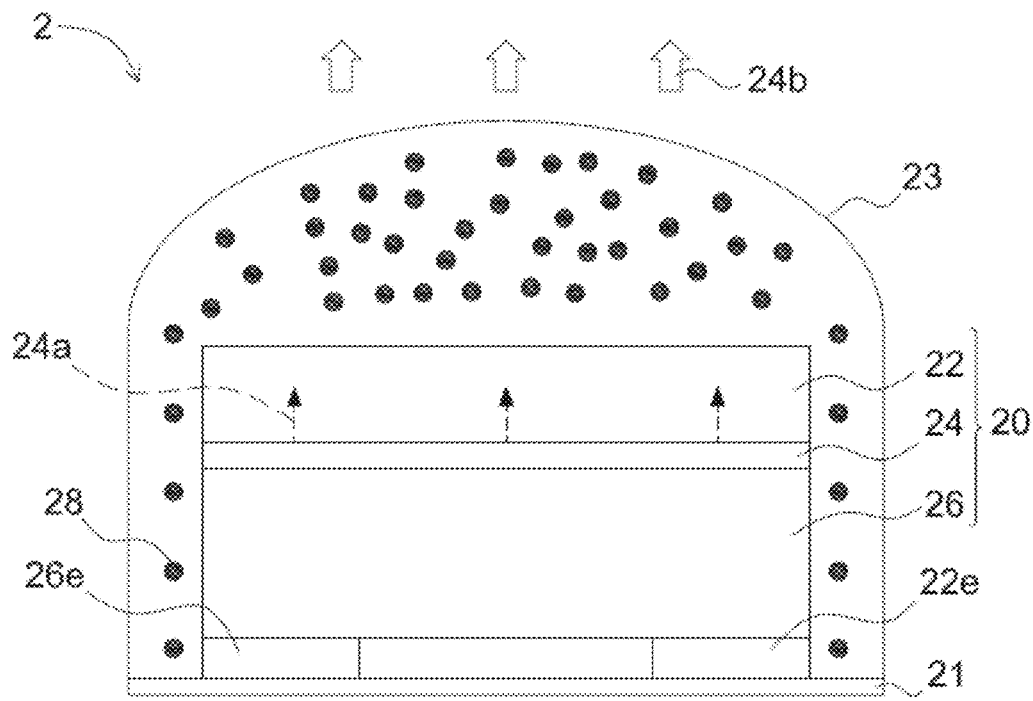
FIG. 5 illustrates an optoelectronic apparatus using a phosphate compound of the present application.
Figure 6:
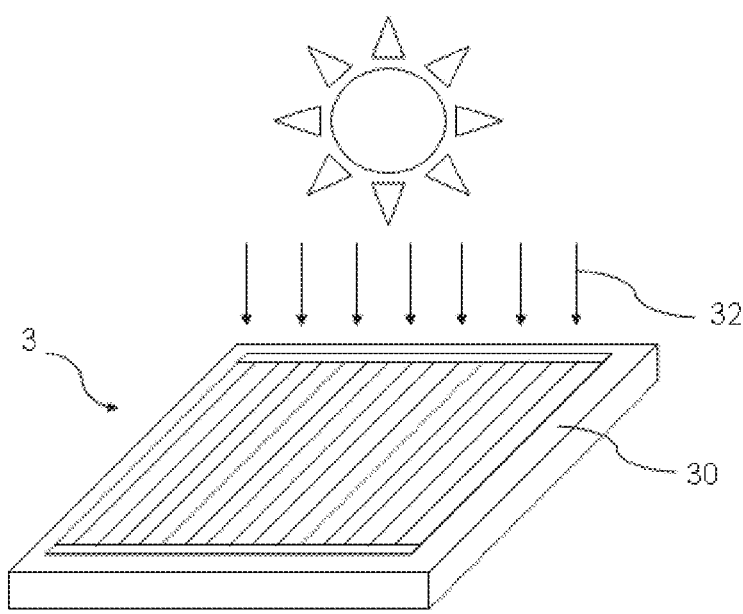
FIG. 6 illustrates an optoelectronic apparatus using a phosphate compound of the present application.

The wavelength converting material of phosphate compound provided in the present application can be extensively applied to various optoelectronic apparatus such as light-emitting diode, plasma emission device, solar cell, and other solid-state illumination device. FIGS. 4-6 show embodiments of optoelectronic apparatus associated with the wavelength converting material of phosphate compound. As shown in FIG. 4, an optoelectronic apparatus 1 comprises a light-emitting device 10 capable of radiating a first light with a first dominant wavelength between 250 nm and 450 nm formed on a support substrate 11, wherein the light-emitting device 10 comprises a first conductivity type semiconductor layer 12, a second conductivity type semiconductor layer 16, and an active layer 14 formed between the first conductivity type semiconductor layer 12 and the second conductivity type semiconductor layer 16. The optoelectronic apparatus 1 further comprises a first electrode 12e electrically connected to the first conductivity type semiconductor layer 12 and a second electrode 16e electrically connected to the second conductivity type semiconductor layer 16; and a wavelength converting material 18 positioned on the light-emitting device 10 for receiving the first light and comprising a phosphate compound having a chemical formula of $AB_{1-m-n}PO_4:M_m, N_n$, wherein A comprises an alkali metal element, B comprises an alkaline earth metal element, M is a sensitizer comprising a rare-earth element, and N is an acceptor comprising a rare-earth element, wherein $0<m \le 0.3$ and $0<n \le 0.3$, wherein A is at least one element selected from the group consisting of Li, Na, K, Rb and Cs, B is at least one element selected from the group consisting of Mg, Ca, Sr, and Ba, M is at least one element selected from the group consisting of Sc, Y, La, Ce, Pr, Nd, Pm, Sm, Eu, Gd, Tb, Dy, Ho, Er, Tm, Yb and Lu, and N is at least one element selected from the group consisting of Sc, Y, La, Ce, Pr, Nd, Pm, Sm, Eu, Gd, Tb, Dy, Ho, Er, Tm, Yb and Lu. The wavelength converting material is capable of being excited by the first light having the first dominant wavelength between 250 nm and 450 nm to emit a second light having a second dominant wavelength between 900 nm and 1100 nm.

As shown in FIG. 5, an optoelectronic apparatus 2 comprises a light-emitting device 20 capable of radiating a first light 24a with a dominant wavelength between 250 nm and 450 nm formed on a circuit board 21 comprising a circuit thereon, wherein the light-emitting device 20 comprises a first conductivity type semiconductor layer 22, a second conductivity type semiconductor layer 26, and an active layer 24 formed between the first conductivity type semiconductor layer 22 and the second conductivity type semiconductor layer 26. The optoelectronic apparatus 2 further comprises a first electrode 22e electrically connected between the first conductivity type semiconductor layer 22 and the circuit board 21; a second electrode 26e electrically connected between the second conductivity type semiconductor layer 26 and the circuit board 21; a wavelength converting materials 28 positioned on the light-emitting device 20 for receiving the first light 24a; and a transparent encapsulating layer 23 formed on the circuit board 21 and covering the light-emitting device 20, wherein the wavelength converting materials 28 is distributed in the transparent encapsulating layer 23 for receiving the first light 24a to emit a second light 24b having a second dominant wavelength between 900 nm and 1100 nm. The wavelength converting material comprises a phosphate compound having a chemical formula of $AB_{1-m-n}PO_4:M_m, N_n$, wherein A comprises an alkali metal element, B comprises an alkaline earth metal element, M is a sensitizer comprising a rare-earth element, and N is an acceptor comprising a rare-earth element, wherein $0<m \le 0.3$ and $0<n \le 0.3$, wherein A is at least one element selected from the group consisting of Li, Na, K, Rb and Cs, B is at least one element selected from the group consisting of Mg, Ca, Sr, and Ba, M is at least one element selected from the group consisting of Sc, Y, La, Ce, Pr, Nd, Pm, Sm, Eu, Gd, Tb, Dy, Ho, Er, Tm, Yb and Lu, and N is at least one element selected from the group consisting of Sc, Y, La, Ce, Pr, Nd, Pm, Sm, Eu, Gd, Tb, Dy, Ho, Er, Tm, Yb and Lu. In an embodiment, the optoelectronic apparatus 2 can be a light-emitting diode (LED).

As shown in FIG. 6, an optoelectronic apparatus 3 comprises a wavelength converting material (not shown) comprising a phosphate compound having a chemical formula of $AB_{1-m-n}PO_4:M_m, N_n$, wherein A comprises an alkali metal element, B comprises an alkaline earth metal element, M is a sensitizer comprising a rare-earth element, and N is an acceptor comprising a rare-earth element, wherein $0<m \le 0.3$ and $0<n \le 0.3$, wherein A is at least one element selected from the group consisting of Li, Na, K, Rb and Cs, B is at least one element selected from the group consisting of Mg, Ca, Sr, and Ba, M is at least one element selected from the group consisting of Sc, Y, La, Ce, Pr, Nd, Pm, Sm, Eu, Gd, Tb, Dy, Ho, Er, Tm, Yb and Lu, and N is at least one element selected from the group consisting of Sc, Y, La, Ce, Pr, Nd, Pm, Sm, Eu, Gd, Tb, Dy, Ho, Er, Tm, Yb and Lu. The wavelength converting material is capable of being excited by a first light 32 to emit a second light (not shown), wherein the first light comprises UV or blue light and the second light comprises near infrared light having a second dominant wavelength between 900 nm and 1100 nm. The optoelectronic apparatus 3 further comprises an optoelectronic device 30 with the wavelength converting material formed thereon absorbing the second light and converting photon energy of the second light into electrical energy. In an embodiment, the optoelectronic apparatus 3 can be a solar cell module and the optoelectronic device 30 can be a solar cell.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A wavelength converting material comprising a phosphate compound having a chemical formula of $AB_{1-m-n}PO_4$: $M_m$, $N_n$, wherein A comprises an alkali metal element, B comprises an alkaline earth metal element, M is a sensitizer and at least one element selected from the group consisting of Sc, Y, La, Ce, Pr, Nd, Pm, Sm, Eu, Gd, Tb, Dy, Ho, Er, Tm, and Lu, and N is an acceptor and comprising a Yb element, the wavelength converting material is configured to emit a light with a peak wavelength ranging from 960 to 1040 nm, and wherein $0<m<0.3$ and $0<n<0.3$.

2. The wavelength converting material according to claim 1, wherein A is at least one element selected from the group consisting of Li, Na, K, Rb and Cs, B is at least one element selected from the group consisting of Mg, Ca, Sr, and Ba.

3. The wavelength converting material according to claim 1, wherein the wavelength converting material is capable of being excited by UV or blue light.

4. The wavelength converting material according to claim 3, wherein the sensitizer can absorb the energy of UV or blue light via 4f-5d transition.

5. The wavelength converting material according to claim 4, wherein the energy absorbed by the sensitizer can be transferred to the acceptor.

6. The wavelength converting material according to claim 1, wherein the wavelength converting material is capable of being excited by a first light having a peak wavelength between 250 nm and 450 nm.

7. A method of synthesizing the wavelength converting material according to claim 1, comprising the steps of:
    providing a mixture of precursors containing phosphate of A, carbonate of B, oxide of M and oxide of N; and
    sintering the mixture in a furnace under a condition of a temperature between 1000° C. and 1500° C., a firing time between 1 hour and 8 hours, and/or an atmosphere containing hydrogen gas.

8. An optoelectronic apparatus, comprising:
    a light-emitting device capable of radiating a first light with a dominant wavelength; and
    the wavelength converting material according to claim 1, positioned on the light-emitting device.

9. The optoelectronic apparatus according to claim 8, wherein A is at least one element selected from the group consisting of Li, Na, K, Rb and Cs, B is at least one element selected from the group consisting of Mg, Ca, Sr, and Ba.

10. The optoelectronic apparatus according to claim 8, wherein the wavelength converting material is capable of being excited by the first light having a first dominant wavelength between 250 nm and 450 nm.

11. The optoelectronic apparatus according to claim 8, wherein the light-emitting device comprises a first conductivity type semiconductor layer, a second conductivity type semiconductor layer, and an active layer formed between the first conductivity type semiconductor layer and the second conductivity type semiconductor layer.

12. The optoelectronic apparatus according to claim 8, further comprising:
    a circuit board comprising a circuit thereon, where the light-emitting device is formed thereon; and
    a transparent encapsulating material formed on the circuit board and covering the light-emitting device, wherein the wavelength converting material is distributed in the transparent encapsulating material.

13. An optoelectronic apparatus, comprising:
    the wavelength converting material according to claim 1, wherein the wavelength converting material is capable of being excited by a first light to emit a second light; and
    an optoelectronic device with the wavelength converting material formed thereon absorbing the second light and converting photon energy of the second light into electrical energy.

14. The optoelectronic apparatus according to claim 13, wherein A is at least one element selected from the group consisting of Li, Na, K, Rb and Cs, B is at least one element selected from the group consisting of Mg, Ca, Sr, and Ba.

15. The optoelectronic apparatus according to claim 13, wherein the first light is UV or blue light.

16. The optoelectronic apparatus according to claim 13, wherein the second light is near infrared light.

17. The optoelectronic apparatus according to claim 13, wherein the optoelectronic device comprises solar cell.

18. The wavelength converting material according to claim 1, wherein the light has a peak wavelength ranging between 960 nm and 1000 nm.

19. The wavelength converting material according to claim 6, wherein the light and the first light have a peak wavelength difference of greater than 500 nm.

* * * * *